(12) United States Patent
Tu

(10) Patent No.: US 8,357,952 B2
(45) Date of Patent: Jan. 22, 2013

(54) POWER SEMICONDUCTOR STRUCTURE WITH FIELD EFFECT RECTIFIER AND FABRICATION METHOD THEREOF

(75) Inventor: Kao-Way Tu, New Taipei (TW)

(73) Assignee: Great Power Semiconductor Corp., New Taipei (TW)

( * ) Notice: Subject to any disclaimer, the term of this patent is extended or adjusted under 35 U.S.C. 154(b) by 0 days.

(21) Appl. No.: 13/082,365

(22) Filed: Apr. 7, 2011

(65) Prior Publication Data

US 2011/0278642 A1 Nov. 17, 2011

(30) Foreign Application Priority Data

May 13, 2010 (TW) .................. 99115353 A

(51) Int. Cl.
*H01L 29/66* (2006.01)
*H01L 21/332* (2006.01)
*H01L 21/336* (2006.01)

(52) U.S. Cl. ........ 257/130; 257/119; 257/121; 257/124; 257/125; 257/135; 257/E25.014; 257/E25.015; 257/E25.016; 257/E29.181; 257/E29.183; 257/E23.31; 257/E45.001; 438/133; 438/134; 438/135; 438/136; 438/137; 438/138; 438/270

(58) Field of Classification Search ................... 257/119, 257/122, 124, 125, 130, 134, 135, 141, E29.181, 257/E29.183, E29.189, E29.31, E45.001, 257/121, E25.014–E25.016; 438/140, 173, 438/176, 192, 195, 270, 133–138
See application file for complete search history.

(56) References Cited

U.S. PATENT DOCUMENTS

| | | | | |
|---|---|---|---|---|
| 5,818,084 A * | 10/1998 | Williams et al. | ............... | 257/329 |
| 6,049,108 A * | 4/2000 | Williams et al. | ............... | 257/341 |
| 6,221,107 B1 * | 4/2001 | Steiner et al. | ............... | 623/13.14 |
| 6,239,463 B1 * | 5/2001 | Williams et al. | ............... | 257/328 |
| 6,271,562 B1 * | 8/2001 | Deboy et al. | ................... | 257/341 |
| 6,351,018 B1 * | 2/2002 | Sapp | ............................. | 257/499 |
| 6,392,272 B1 * | 5/2002 | Hasegawa | ..................... | 257/329 |
| 7,791,136 B1 * | 9/2010 | Hsieh | ............................ | 257/330 |
| 8,044,461 B2 * | 10/2011 | Session | ........................ | 257/334 |
| 8,125,024 B2 * | 2/2012 | Boden | .......................... | 257/330 |
| 8,138,605 B2 * | 3/2012 | Chang et al. | .................. | 257/751 |
| 2003/0022474 A1 * | 1/2003 | Grover et al. | ................. | 438/570 |
| 2003/0207538 A1 * | 11/2003 | Hshieh et al. | ................. | 438/269 |
| 2008/0199997 A1 * | 8/2008 | Grebs et al. | ................... | 438/270 |
| 2009/0078962 A1 * | 3/2009 | Ankoudinov et al. | ........ | 257/130 |
| 2009/0267111 A1 * | 10/2009 | Ankoudinov et al. | ........ | 257/124 |
| 2009/0315106 A1 * | 12/2009 | Hsieh | ............................ | 257/334 |
| 2009/0315107 A1 * | 12/2009 | Hsieh | ............................ | 257/334 |
| 2010/0279478 A1 * | 11/2010 | Hsieh | ............................ | 438/270 |
| 2011/0121386 A1 * | 5/2011 | Hsieh | ............................ | 257/334 |
| 2011/0133271 A1 * | 6/2011 | Chuang | ........................ | 257/334 |
| 2012/0080748 A1 * | 4/2012 | Hsieh | ............................ | 257/331 |

* cited by examiner

*Primary Examiner* — Cheung Lee
*Assistant Examiner* — Jeremy Joy
(74) *Attorney, Agent, or Firm* — Lai & Cai Intellectual Property (USA) Office

(57) ABSTRACT

A power semiconductor structure with a field effect rectifier having a drain region, a body region, a source region, a gate channel, and a current channel is provided. The body region is substantially located above the drain region. The source region is located in the body region. The gate channel is located in the body region and adjacent to a gate structure. The current channel is located in the body region and is extended from the source region downward to the drain region. The current channel is adjacent to a conductive structure coupled to the source region.

14 Claims, 10 Drawing Sheets

POWER SEMICONDUCTOR STRUCTURE WITH FIELD EFFECT RECTIFIER AND FABRICATION METHOD THEREOF

BACKGROUND OF THE INVENTION

1. Field of the Invention

This invention relates to a power semiconductor structure and a fabrication method thereof, and more particularly relates to a power semiconductor with a field effect rectifier and a fabrication method thereof.

2. Description of Related Art

Switching speed is an important issue for trenched power semiconductor applications. For high frequency operations of power semiconductors, the increasing of switching speed is helpful for reducing switching loss. However, the power transistor has its structural limitation that the switching speed thereof is restricted by the reverse recovery time of body diode located between source and drain electrodes.

In order to resolve this problem, as shown in FIG. 1, a typical method is to connect a schottky diode SD1 between the source electrode and the drain electrode of the transistor T1 as a current path to replace the body diode D1. Since the turn-on voltage of the schottky diode SD1 is significantly lower than that of the body diode D1, current flow from the source electrode would be directed to the current path including the schottky diode SD1 and the body diode D1 would not be turned on.

Although it is an effective method to integrate a schottky diode SD1 to the transistor for solving the problem of long reverse recovery time due to body diode D1, typical transistor fabrication process does not suitable for the formation of the additional schottky diode. The fabrication process must be changed and some additional fabrication steps are usually unpreventable. As a result, the fabrication process becomes quite complicated and the cost is enhanced.

SUMMARY OF THE INVENTION

It is an object of the present invention to provide a power semiconductor structure and a fabrication method thereof. The power semiconductor structure features a field effect rectifier as a current channel to prevent the body diode of the transistor from being turned on so as to enhance switching speed of transistors.

According to an embodiment of the present invention, a power semiconductor structure with a field effect rectifier is provided. The power semiconductor structure has a drain region, a body region, a source region, a gate channel, and a current channel. The body region is located above the drain region and the source region is located in the body region. The gate channel is located in the body region and is adjacent to a gate structure. The current channel, which is located in the body region, is adjacent to a conductive structure, which is coupled to the source region. The current channel is extended from the source region downward to the drain region such that the current channel is connected to the gate channel in parallel.

According to another embodiment of the present invention, a fabrication method of the above mentioned power semiconductor structure with a field effect rectifier is also provided. The fabrication method comprises the steps of: (a) providing a base with a drain region formed therein; (b) forming a conductive structure above the drain region; (c) forming a body region surrounding the conductive structure; and (d) forming a source region above the body region to connect the conductive structure. Thereby, a current channel, which is connected to a gate channel in parallel, is formed in the body region adjacent to the conductive structure and is extended from the source region downward to the drain region.

DETAILED DESCRIPTION OF THE PREFERRED EMBODIMENTS

Figure 1:
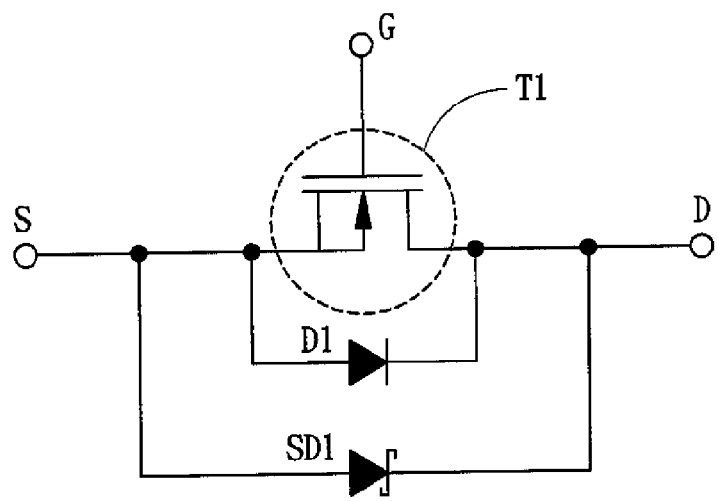
FIG. 1 is a schematic view showing a typical power transistor with a schottky diode for reducing switching loss.
Figure 2A:
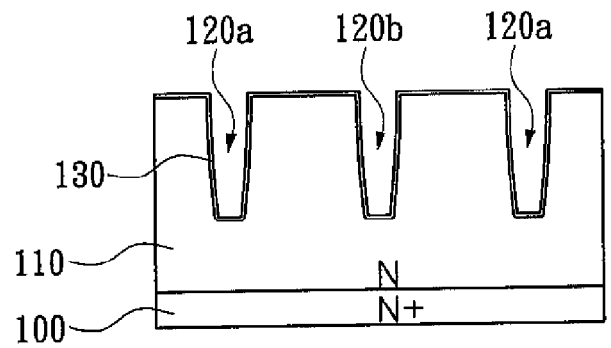
FIGS. 2A to 2G are schematic views showing a fabrication method of a power semiconductor structure with a field effect rectifier in accordance with a first embodiment of the present invention.

FIGS. 2A to 2G are schematic views showing a fabrication method of a power semiconductor structure with a field effect rectifier in accordance with a first preferred embodiment of the present invention. As shown in FIG. 2A, firstly, an N-type heavily doped substrate 100 is provided. The substrate 100 is covered with an N-type epitaxial layer 110 so as to form a base for locating the power semiconductor units. Thereafter, a plurality of trenches 120a and 120b are formed in the epitaxial layer 110. These trenches 120a, 120b can be sorted into two portions, the trenches 120a for defining the location of gate electrodes of the MOSFET and the trenches 120b for defining the location of field effect rectifiers (FER).

Thereafter, a gate dielectric layer 130 is formed on the epitaxial layer 110 to line the inner surface of the gate trenches 120a. In the present embodiment, the gate dielectric layer 130 is extended to the inner surface of the second trench 120b. In other words, the dielectric layer lining the inner surface of the second trench 120b is simultaneously formed in the step of forming the gate dielectric layer 130.

Figure 2B:
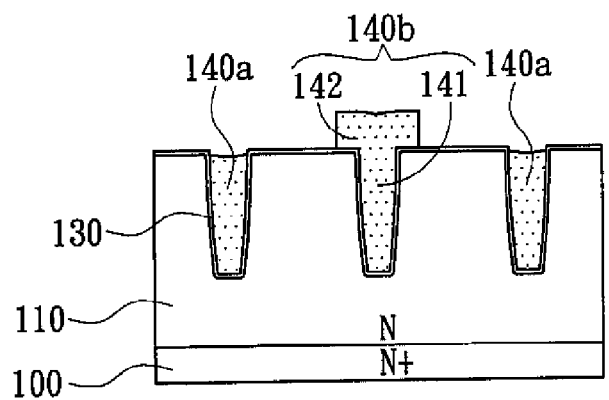

Afterward, as shown in FIG. 2B, a polysilicon layer is deposited on the epitaxial layer 110, and then a lithographic and etching step is carried out to remove a portion of the polysilicon layer over the upper surface of the epitaxial layer 110 so as to leave the gate polysilicon structure 140a in the gate trench 120a and the second polysilicon structure 140b in the second trench 120b. The gate polysilicon structure 140a may be totally located in the gate trench 120a. The second polysilicon structure 140b has a vertical portion 141 located in the second trench 120b and a horizontal portion 142 located above the second trench 120b covering the epitaxial layer 110 within a predetermined range from the second trench 120b. The second polysilicon structure 140b is functioned as a conductive structure of the field effect rectifier. An etching back step may be used to form the gate polysilicon structure 140a in the gate trench 120a, and the second polysilicon structure 140b may be defined in a lithographic step prior to the etching back step.

Figure 2C:
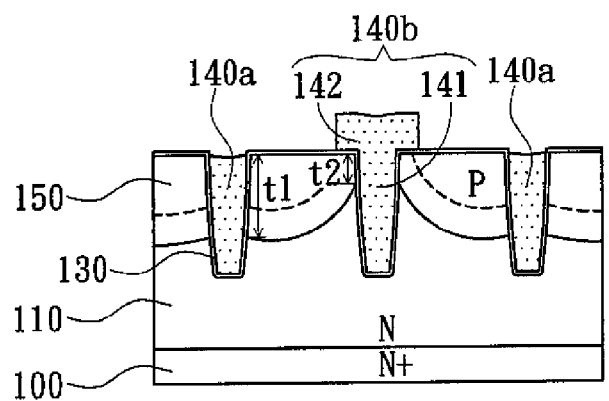

Thereafter, as shown in FIG. 2C, an ion implantation step is carried out to implant P-type dopants into the epitaxial layer 110 and then a thermal drive-in step is used to diffuse the implanted P-type dopants such that the body region 150 encircling both the gate polysilicon structure 140a and the second polysilicon structure 140b is formed in the upper portion of the epitaxial layer 110. In addition, since the horizontal portion 142 of the second polysilicon structure 140b is located above the second trench 120b to shield the epitaxial layer 110 adjacent to the second trench 120b, the profile of a lower surface of the body region 150 shows a depth t2 adjacent to the second polysilicon structure 140b being smaller than a depth t1 adjacent to the gate polysilicon structure 140a.

Figure 2D:
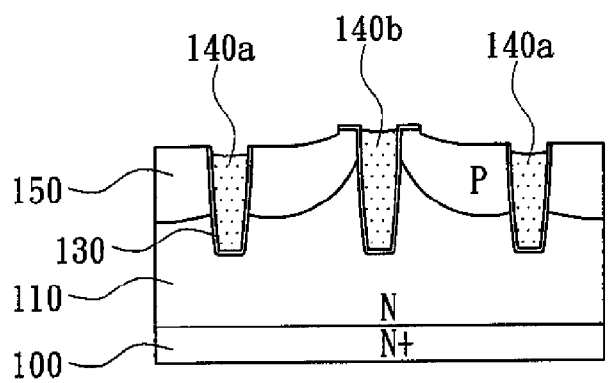

Thereafter, as shown in FIG. 2D, the horizontal portion 142 of the second polysilicon structure 140b is removed by etching and the body region 150 adjacent to the second polysilicon structure 140b is thus exposed. As a preferred embodiment, the etching step may be carried out by using a blanket poly etch process applied to the second polysilicon structure 140b, the body region 150, and the gate polysilicon structure 140a. After the etching process, as shown in FIG. 2D, the horizontal portion 142 of the second polysilicon structure 140b may be totally removed, and the surface portion of the body region 150 as well as a portion of the gate polysilicon structure 140a are recessed.

Figure 2E:
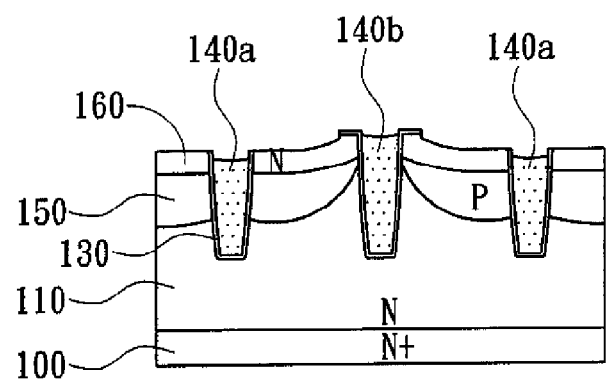
Figure 2F:
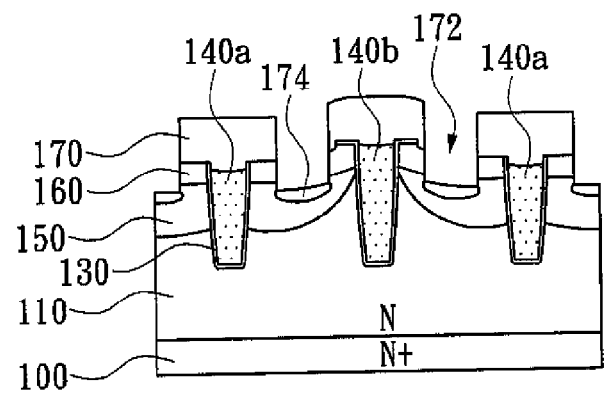

Next, as shown in FIG. 2E, the surface layer of the body region 150 is implanted with N-type dopants to form the source doped region 160 surrounding the polysilicon gate structure 140a and the second polysilicon structure 140b. Thereafter, as shown in FIG. 2F, an interlayer dielectric layer 170 is formed on the epitaxial layer 110 to shield the polysilicon gate structure 140a and the second polysilicon structure 140b. Then, a plurality of contact windows 172 is formed in the interlayer dielectric structure 170 to expose the source doped regions 160. These contact windows 172 are extended to the body region 150 below the source doped regions 160. Afterward, the bottom of the contact window 172 is implanted with P-type dopants to form the heavily doped region 174 in the body region 150. Finally, as shown in FIG. 2G, a source metal layer 180 is deposited on the interlayer dielectric layer 170 to fill the contact windows 172 and be electrically connected to the source doped region 160.

Figure 2G:
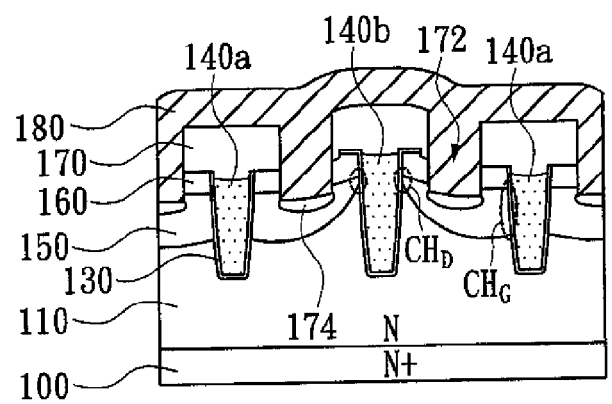

As shown in FIG. 2G, the power semiconductor structure fabricated by using the fabrication method of the present embodiment has a drain region, which includes the N-type heavily doped substrate 100 and the N-type region of the epitaxial layer 110, a body region 150, a source doped region 160, a gate polysilicon structure 140a, and a second polysilicon structure 140b. The body region 150 may be located above the drain region, and the source region 160 may be located in the body region 150. A gate channel $CH_G$ is formed in the body region 150 adjacent to the gate polysilicon structure 140a and the status of the gate channel $CH_G$ is controlled by the potential level of the gate polysilicon structure 140a.

In contrast with the gate polysilicon structure 140a, the second polysilicon structure 140b receives the source voltage instead of the gate voltage and a current channel $CH_D$ is formed in the body region 150 adjacent to the second polysilicon structure 140b. The current channel $CH_D$ is extended from the source region 160 downward to the drain region so as to generate a current path parallelly connected to the gate channel $CH_G$. Since the depth t2 of the body region 150 with respect to the current channel $CH_D$ is much smaller than the depth t1 of the body region 150 with respect to the gate channel $CH_G$, the current channel $CH_D$, which may be ranged between 0.1 to 0.6 micron, is much shorter than the gate channel $CH_G$. As the source to drain voltage of the power semiconductor structure is forwardly biased, the current channel $CH_D$ represents the characteristic similar to the Schottky Diode. That is, the current from the source doped region 160 is directed to the current channel $CH_D$ to prevent body diode of the power transistor from being turned on.

Figure 3:
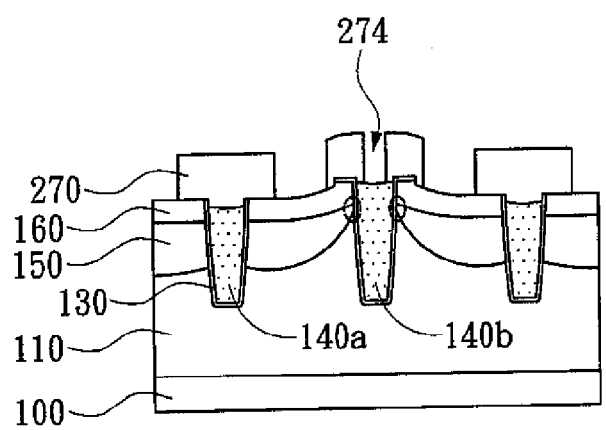
FIG. 3 is a schematic view showing a fabrication method of a power semiconductor structure with a field effect rectifier in accordance with a second embodiment of the present invention.

FIG. 3 is a schematic view showing a power semiconductor structure with a field effect rectifier in accordance with a second preferred embodiment of the present invention. A major difference between the present embodiment and the first embodiment lies in the interlayer dielectric layer 270. The interlayer dielectric layer 270 of the present embodiment has opens 274 aligning to the second polysilicon structure 140b. The source metal layer 180 deposited thereon is electrically connected to the second polysilicon structure 140b through the opens 274 for applying source voltage.

Figure 4:
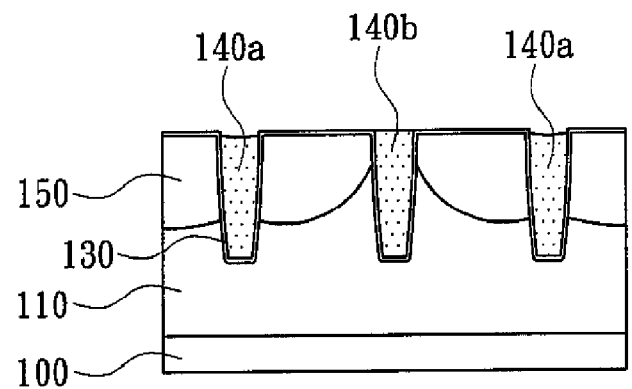
FIG. 4 is a schematic view showing a fabrication method of a power semiconductor structure with a field effect rectifier in accordance with a third embodiment of the present invention.

FIG. 4 is a schematic view showing a fabrication method of a power semiconductor structure with a field effect rectifier in accordance with a third embodiment of the present invention. A major difference between the present embodiment and the first embodiment lies in the step to remove the horizontal portion 142 of the second polysilicon structure 140b. In the present embodiment, the horizontal portion 142 of the second polysilicon structure 140b protruding the epitaxial layer 110 is removed by using chemical mechanical polishing process instead of etching. The following steps of the present embodiment are similar to the first embodiment and thus are not repeated here.

Figure 5A:
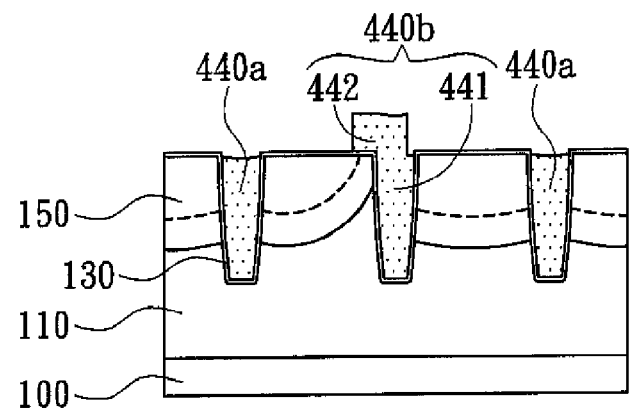
FIGS. 5A and 5B are schematic views showing a fabrication method of a power semiconductor structure with a field effect rectifier in accordance with a fourth embodiment of the present invention.
Figure 5B:
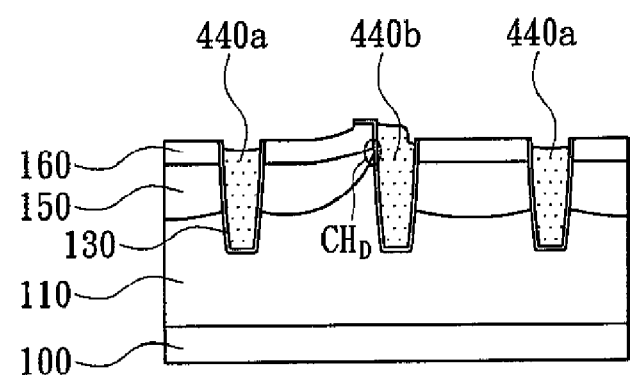

FIGS. 5A and 5B are schematic views showing a fabrication method of a power semiconductor structure with a field effect rectifier in accordance with a fourth embodiment of the present invention. A major difference between the present embodiment and the first embodiment lies in the horizontal portion 442 of the second polysilicon structure 440b. In the present embodiment, the horizontal portion 442 merely covers the epitaxial layer 110 on one side of the second polysilicon structure 440b, and only the side of the second polysilicon structure 440b covered by the horizontal portion 442 has a current channel $CH_D$ formed therein.

Figure 6A:
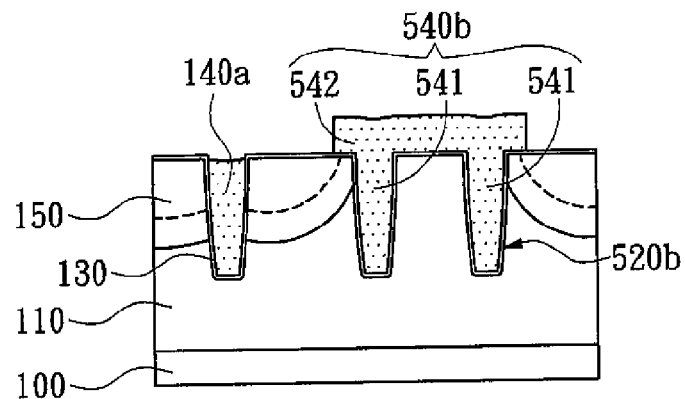
FIGS. 6A to 6C are schematic views showing a fabrication method of a power semiconductor structure with a field effect rectifier in accordance with a fifth embodiment of the present invention.
Figure 6B:
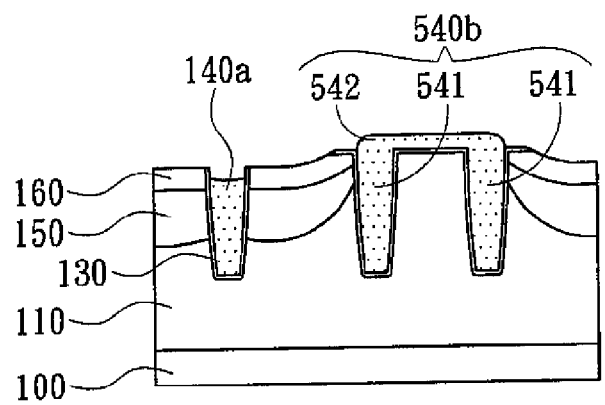
Figure 6C:
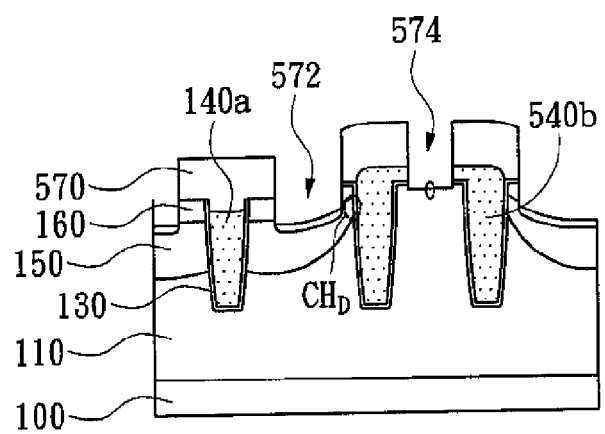

FIGS. 6A to 6C are schematic views showing a fabrication method of a power semiconductor structure with a field effect rectifier in accordance with a fifth embodiment of the present invention. As shown in FIG. 6A, the second polysilicon structure 540b of the present embodiment has two vertical portions 541 located in two neighboring second trenches 520b respectively. The epitaxial layer 110 between the two second trenches 520b are shielded by the horizontal portion 542 of the second polysilicon structure 540b. Thus, no body region is formed in the epitaxial layer 110 between the two second trenches 520b.

Thereafter, as shown in FIG. 6B, the second polysilicon structure 540b is etched to expose the body region 150 adjacent to the second polysilicon structure 540b. In the present embodiment, an isotropic etching process is used to reduce the width of the horizontal portion 542 so as to expose the body region 150 below the horizontal portion 542. It is noted that after the etching step, a portion of the second polysilicon structure 540b still remains on the epitaxial layer 110 between the two neighboring second trenches 520b. The remained second polysilicon structure 540b is utilized as the mask for implanting N-type dopants into the surface layer of the body region 150 to form the source doped region 160.

Next, as shown in FIG. 6C, an interlayer dielectric layer 570 is formed on the epitaxial layer 110 to cover the gate polysilicon structure 140a and the second polysilicon structure 540b. Then, a plurality of contact windows 572 is formed in the interlayer dielectric layer 570 to expose the source doped region 160. Meanwhile, at least a schottky contact window 574 aligning to the second polysilicon structure 540b is formed in the interlayer dielectric layer 570 to expose the epitaxial layer 110. Thereby, not only the current channel $CH_D$ is formed in the body region 150 adjacent to the side surface of the second polysilicon structure 540b, but a schottky diode is also formed at the middle of the second polysilicon structure 540b.

Figure 7A:
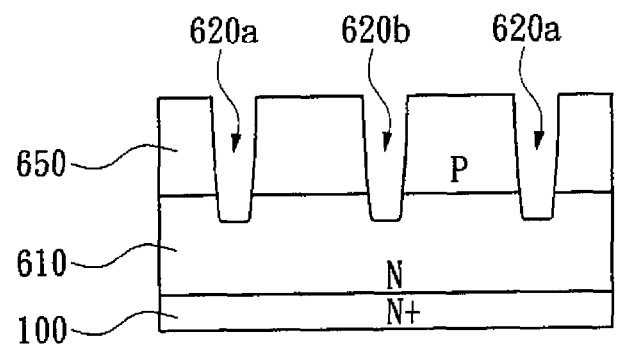
FIGS. 7A to 7C are schematic views showing a fabrication method of a power semiconductor structure with a field effect rectifier in accordance with a sixth embodiment of the present invention.
Figure 7B:
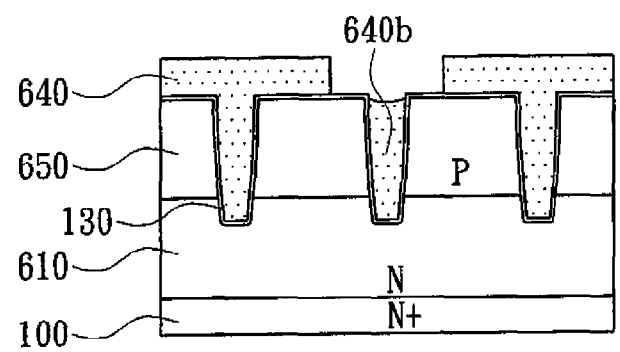
Figure 7C:
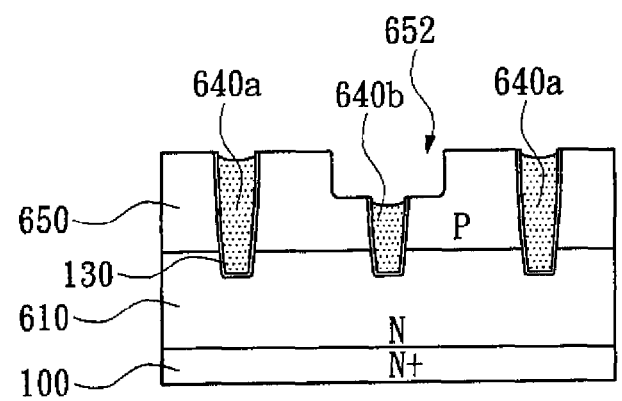

FIGS. 7A to 7C are schematic views showing a fabrication method of a power semiconductor structure with a field effect rectifier in accordance with a sixth preferred embodiment of the present invention. As shown in FIG. 7A, firstly, an N-type heavily doped substrate 100 is provided, and an N-type epitaxial layer 610 is formed on the substrate 100. Thereafter, a P-type body layer 650 is formed on the N-type epitaxial layer 610. Then, a plurality of gate trenches 620a and at least a second trench 620b are formed in the P-type body layer 650. These trenches 620a and 620b penetrate the P-type body layer 650 and extend into the N-type epitaxial layer 610.

Thereafter, as shown in FIG. 7B, a gate dielectric layer 130 is formed to line the inner surfaces of the gate trenches 620a and the second trench 620b. Afterward, a polysilicon layer 640 is deposited on the body layer 650. Then, the portion of the polysilicon layer 640 within a predetermined range from the second trench 620b is selectively etched by using lithographic and etching processes, but a portion of the polysilicon layer 640 remains inside the second trench 620b as the second polysilicon structure 640b. Thereafter, as shown in FIG. 7C, the unwanted portion of the polysilicon material over the body layer 650 is removed by etching to leave the polysilicon gate 640a inside the gate trenches 620a. It is noted that a hollow area 652 is also formed in the body layer 650 at a location with respect to the second polysilicon structure 640b during the present etching step. Thus, the thickness of the body layer 650 adjacent to the second polysilicon structure 640b would be smaller than that adjacent to the gate polysilicon structure 640a because of the hollow area 652, and a current channel $CH_D$ with a length much shorter than the gate channel $CH_G$ is formed adjacent to the second polysilicon structure 640a.

Figure 8A:
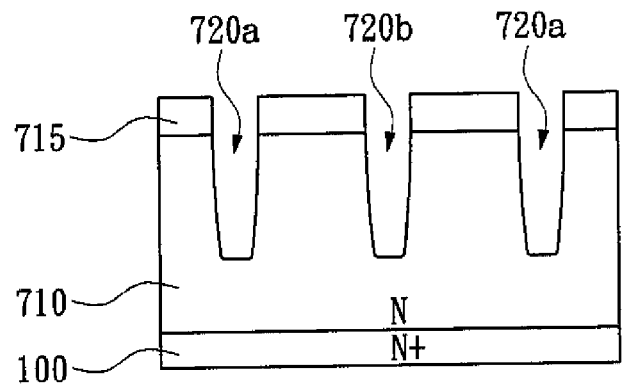
FIGS. 8A to 8H are schematic views showing a fabrication method of a power semiconductor structure with a field effect rectifier in accordance with a seventh embodiment of the present invention.

FIGS. 8A to 8H are schematic views showing a fabrication method of a power semiconductor structure with a field effect rectifier in accordance with a seventh embodiment of the present invention. As shown in FIG. 8A, firstly, an N-type heavily doped substrate 100 is provided. Then, an N-type epitaxial layer 710 is formed on the substrate 100. Thereafter, a hard mask 715 is formed on the epitaxial layer 710 to define a plurality of gate trenches 720a and at least a second trench 720b in the epitaxial layer 710.

Figure 8B:
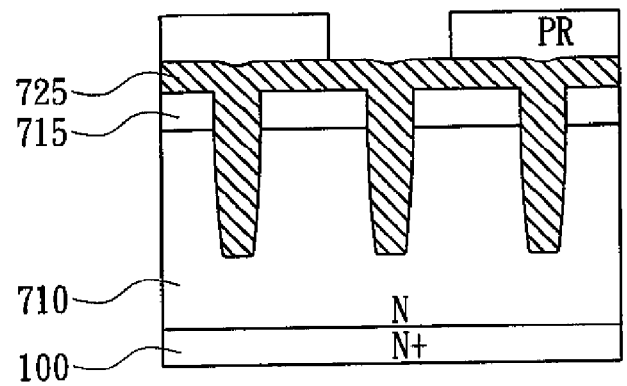
Figure 8C:
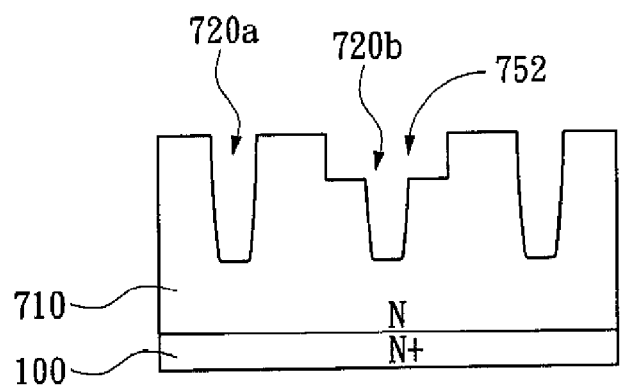

Thereafter, as shown in FIG. 8B, a dielectric layer 725 is deposited over the hard mask 715 and fills the trenches 720a and 720b. Then, a photo-resist pattern PR is formed on the dielectric layer 725 to define the range of a hollow area. Afterward, as shown in FIG. 8C, the dielectric layer 725, the hard mask 715, and the epitaxial layer 710 are etched with the photo-resist pattern PR as an etching mask so as to form a hollow area 752 in the epitaxial layer 710 adjacent to the second trench 720b. Then, the remained dielectric layer 725 and the remained hard mask 715 are removed to expose the inner surface of the trenches 720a and 720b.

In brief, the above mentioned fabrication process adopts a first lithographic and etching step to form a plurality of gate trenches 720a as well as at least a second trench 720b in the epitaxial layer 710, and adopts a second lithographic and etching step to form the hollow area 752 in the body region 750 to widen the upper portion of the second trench 720b.

Figure 8D:
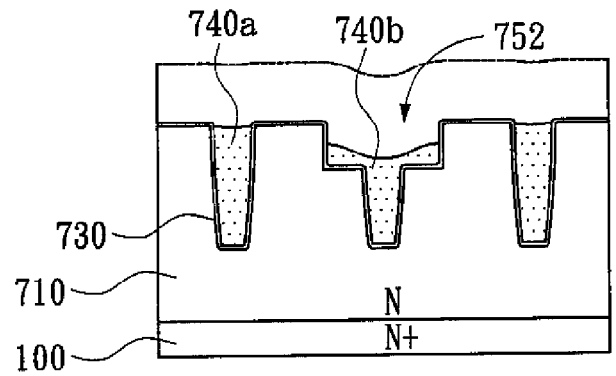

Next, as shown in FIG. 8D, a gate dielectric layer 730 is formed on the inner surface of the gate trench 720a and the second trench 720b. Thereafter, a polysilicon layer, indicated by the dashed line, is deposited on the epitaxial layer 710. Then, the polysilicon material on the upper surface of the epitaxial layer 710 is removed by etching, such as the etching back process. Thus, the gate polysilicon structure 740a is formed in the gate trench 720a, and the second polysilicon structure 740b is also formed to fill the second trench 720b and covers the bottom of the hollow area 752.

Figure 8E:
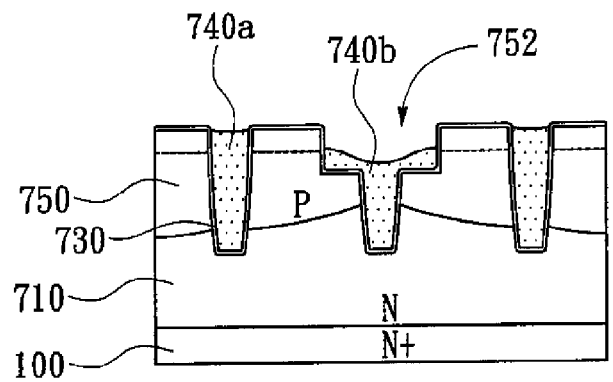

Next, as shown in FIG. 8E, an ion implantation step is carried out to implant P-type dopants into the epitaxial layer 710 through the second polysilicon structure 740b so as to form a body region 750 surrounding the gate polysilicon structure 740a and the second polysilicon structure 740b. Since the epitaxial layer 710 adjacent to the second trench 720b with respect to the hollow area 752 is shielded by the second polysilicon structure 740b, the thickness of the body region 750 adjacent to the second polysilicon structure 740b would be much smaller than that adjacent to the gate polysilicon structure 740a.

Figure 8F:
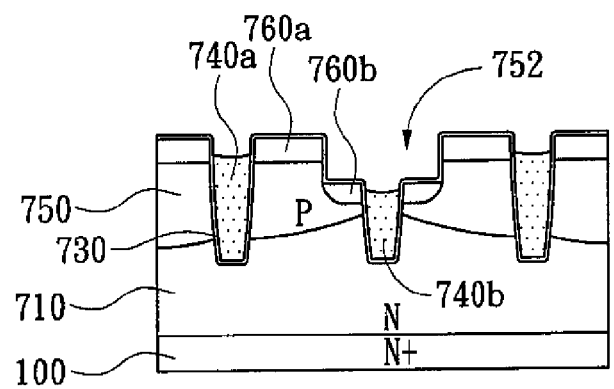

Thereafter, as shown in FIG. 8F, the polysilicon material on the bottom of the hollow area 752 is removed to expose the bottom of the hollow area 752. Then, an ion implantation step is carried out to implant N-type dopants to the surface layer of the body region 750 as well as the bottom of the hollow area 752 so as to form the source doped regions 760a and 760b surrounding the gate polysilicon structure 740a and the second polysilicon structure 740b respectively.

Figure 8G:
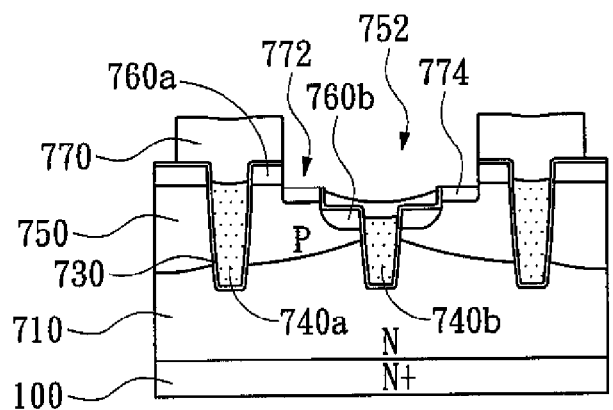

Afterward, as shown in FIG. 8G, an interlayer dielectric layer 770 is formed on the epitaxial layer 710 to cover the gate polysilicon structure 740a and the second polysilicon structure 740b. Thereafter, a plurality of contact windows 772 is formed in the interlayer dielectric layer 770 to expose the body region 750 between the source doped regions 760a and 760b. The bottom of the contact windows 772 is then implanted with P-type dopants to form the P-type heavily doped region 774 in the body region 750. As shown in FIGS. 8F and 8G, the interlayer dielectric layer 770 above the hollow area 752 is also etched during the step for forming the contact windows 772. Since the interlayer dielectric layer 770 on the hollow area 752 is thicker than the other portions of the interlayer dielectric layer 770, it is able to keep a portion of the interlayer dielectric layer 770 remained on the bottom of the hollow area 752 to shield the second polysilicon structure 740b after the etching step as shown in FIG. 8G.

Figure 8H:
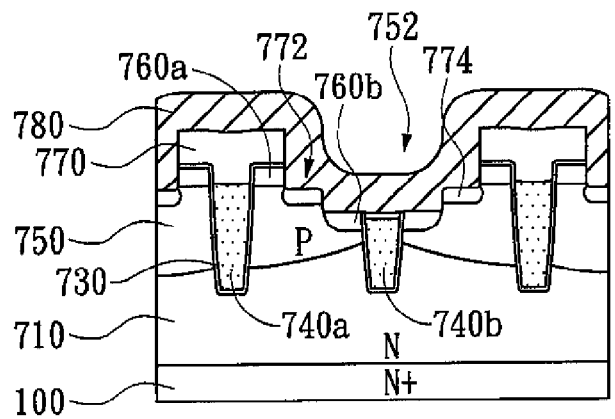

Finally, as shown in FIG. 8H, the interlayer dielectric layer 770 on the bottom of the hollow area 752 is removed. Then, a source metal layer 780 is deposited on the interlayer dielectric layer 770 to fill the contact windows 772 and the hollow area 752 so as to electrically connect the source doped regions 760a and 760b.

Figure 9A:
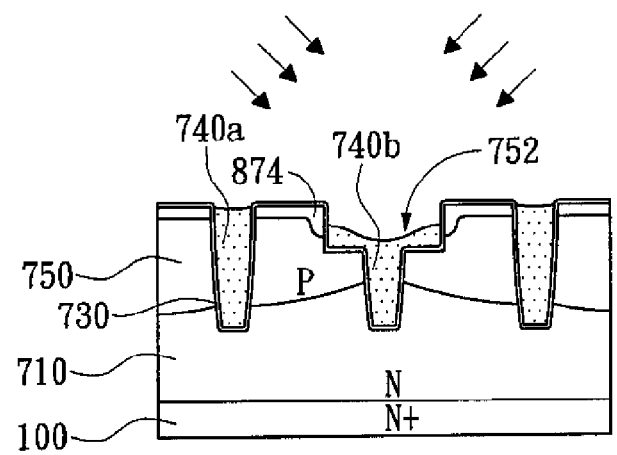
FIGS. 9A to 9C are schematic views showing a fabrication method of a power semiconductor structure with a field effect rectifier in accordance with a eighth embodiment of the present invention.
Figure 9B:
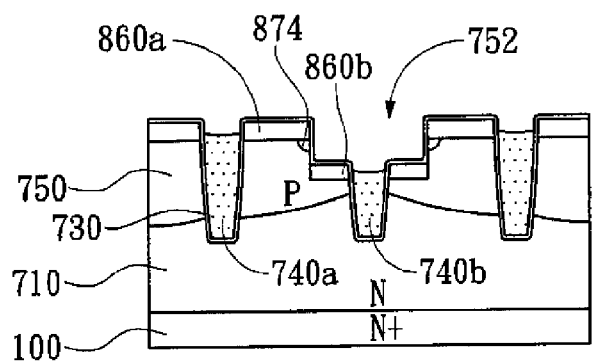
Figure 9C:
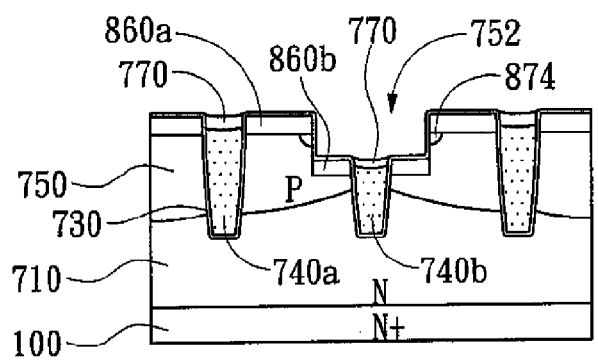

FIGS. 9A to 9C are schematic views showing a fabrication method of a power semiconductor structure with a field effect rectifier in accordance with an eighth preferred embodiment of the present invention. The fabrication step of FIG. 9A follows the step of FIG. 8E in the seventh embodiment. As shown in FIG. 9A, after the formation of the body region 750, a tilted ion implantation process is carried out to implant P-type dopants into the surface layer of the epitaxial layer 710 and the sidewall of the hollow area 752 so as to form the P-type heavily doped region 874. Afterward, as shown in FIG. 9B, the polysilicon material on the bottom of the hollow area 752 is removed to expose the bottom of the hollow area 752. Then, the surface layer of the body region 750 and the bottom of the hollow area 752 are implanted with N-type dopants. The amount of N-type dopants implanted into the surface layer of the body region 750 is great enough to change the conductivity type of the P-type heavily doped region 874 so as to form the N-type source doped region 860a surrounding the gate polysilicon structure 740a. Meanwhile, an N-type source doped region 860b is also formed at the bottom of the hollow area 752 surrounding the second polysilicon structure 740b. It is noted that after the ion implantation step, a portion of the P-type heavily doped region 874 still remains on the sidewall of the hollow area 752.

Thereafter, as shown in FIG. 9C, an interlayer dielectric layer 770 is formed on the epitaxial layer 710. Then, the portions of the interlayer dielectric layer 770 on the upper surface of the epitaxial layer 710 and the bottom of the hollow area 752 are removed to leave the portion shielding the gate polysilicon structure 740a and the second polysilicon structure 740b. The source doped regions 860a, 860b and the P-type heavily doped region 874 are thus exposed.

Figure 10:
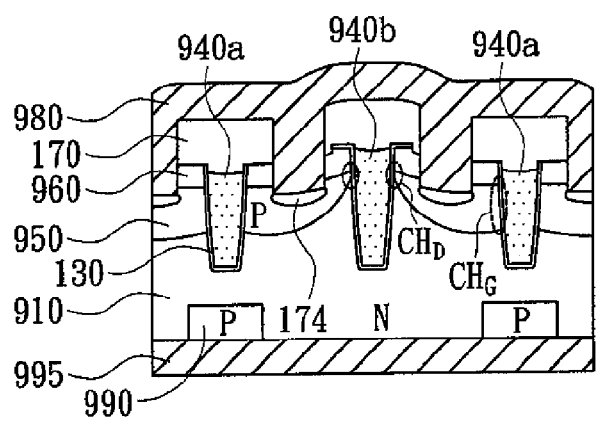
FIG. 10 is a schematic view showing a fabrication method of a power semiconductor structure with a field effect rectifier in accordance with a ninth embodiment of the present invention.

FIG. 10 is a schematic view showing a fabrication method of a power semiconductor structure with a field effect rectifier in accordance with a ninth preferred embodiment of the present invention. Different from the above mentioned embodiments, which integrate a MOSFET with a field effect rectifier in a power semiconductor structure, the present embodiment integrates an IGBT and a field effect rectifier in a power semiconductor structure. As shown, the lower surface of the N-type substrate 910 is implanted with a plurality of P-type doped regions 990 with respect to the gate polysilicon structures 940a on the upper surface of the N-type substrate 910. The metal layer 980 on the upper surface of the N-type substrate 910 is utilized as the emitter of the IGBT and the metal layer 995 on the lower surface of the N-type substrate 910 is utilized as the collector of the IGBT. The upper surface of the N-type substrate 910 has at least a second polysilicon structure 940b thereon coupled to the source metal layer 980 as the conductive structure of the field effect rectifier. A gate channel $CH_G$ is formed in the body region 950 adjacent to the gate polysilicon structure 940a, and a current channel $CH_D$ is formed in the body region 950 adjacent to the second polysilicon structure 940b. The current channel $CH_D$ is connected to the gate channel $CH_G$ in parallel and is extended from the source doped region 960 downward to the N-type substrate 910.

As mentioned, the field effect rectifier in the present invention shows the characteristics similar to the schottky diode. However, in contrast with the schottky diode, the fabrication step for the field effect rectifier in the present invention can be integrated into the power semiconductor structure fabrication process easily. Thus, the present invention is able to prevent the introduction of additional complexity into the fabrication process as well as the increasing of fabrication costs.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

It will be apparent to those skilled in the art that various modifications and variations can be made to the structure of the present invention without departing from the scope of the invention. In view of the foregoing, it is intended that the present invention cover modifications and variations of this invention provided they fall within the scope of the following claims and their equivalents.

What is claimed is:

1. A power semiconductor structure with a field effect rectifier, comprising:
    a drain region;
    a body region, located above the drain region;
    a source region, located in the body region;
    a gate channel, located in the body region and adjacent to a gate structure; and
    a current channel, located in the body region and adjacent to a conductive structure located in a trench and coupled to the source region, the current channel being extended from the source region downward to the drain region, and the current channel is much shorter than the gate channel, wherein the trench extended downward from the source region.

2. The power semiconductor structure with a field effect rectifier of claim 1, wherein the gate channel is extended downward from the source region to the drain region.

3. The power semiconductor structure with a field effect rectifier of claim 2, wherein the gate channel and the current channel are located on the opposite sides of the body region, and a first thickness of the body region with respect to the current channel is smaller than a second thickness of the body region with respect to the gate channel.

4. The power semiconductor structure with a field effect rectifier of claim 3, wherein a first depth of the body region with respect to the current channel is smaller than a second depth of the body region with respect to the gate channel.

5. The power semiconductor structure with a field effect rectifier of claim 3, wherein the body region has a hollow area on an upper surface thereof respective to the conductive structure.

6. A fabrication method of a power semiconductor structure with a field effect rectifier comprising the steps of:
    (a) providing a base with a drain region therein;
    (b) forming a conductive structure above the drain region, wherein the conductive structure is located in a trench, and at least a gate structure is formed in the base;
    (c) forming a body region surrounding the conductive structure; and
    (d) forming a source region in the body region to form a current channel in the body region adjacent to the conductive structure extended downward from the source region to the drain region, and to form a gate channel located in the body region adjacent to the gate structure, wherein the trench extended downward from the source region, and the current channel is much shorter than the gate channel.

7. The fabrication method of a power semiconductor structure with a field effect rectifier of claim 6, further comprising the steps of forming a source metal layer electrically connecting the source region and the conductive structure.

8. The fabrication method of a power semiconductor structure with a field effect rectifier of claim 6, wherein the gate structure is formed in the base during the step of forming the conductive structure.

9. The fabrication method of a power semiconductor structure with a field effect rectifier of claim 6, after the formation of the body region, further comprising the step of forming a hollow area on an upper surface of the body region respective to the conductive structure to have a first thickness of the body region with respect to the current channel being smaller than a second thickness of the body region with respect to the gate channel.

10. The fabrication method of a power semiconductor structure with a field effect rectifier of claim 6, wherein the conductive structure has a horizontal portion, the step of forming the body region is to implant dopants into the base by using the conductive structure as a mask so as to have a first thickness of the body region with respect to the current channel being smaller than a second thickness of the body region with respect to the gate channel.

11. The fabrication method of a power semiconductor structure with a field effect rectifier of claim 6, wherein the step of forming the conductive structure comprises:
    forming at least two trenches in the base;
    forming a dielectric layer lining the inner surface of the trenches; and
    forming the conductive structure and the gate structure in the trenches respectively.

12. The fabrication method of a power semiconductor structure with a field effect rectifier of claim 11, wherein the step of forming at least two trenches in the base comprises:
    forming at least a first trench and at least a second trench in the base by using an first lithographic and etching step; and
    widening an upper portion of the second trench by using a second lithographic and etching step;
    wherein the first trench is utilized for locating the gate structure and the second trench is utilized for locating the conductive structure, and the current channel is located on a side surface of a lower portion of the second trench.

13. The fabrication method of a power semiconductor structure with a field effect rectifier of claim 12, wherein the step of forming the source region above the body region comprises:
    forming a first source region on the side surface of the lower portion of the second trench; and
    forming a second source region in a surface layer of the body region between the first trench and the second trench.

14. The fabrication method of a power semiconductor structure with a field effect rectifier of claim 13, further comprising the step of implanting dopants to the side surface of the widened upper portion of the second trench with a tilted angle.

* * * * *